United States Patent
Gu et al.

(10) Patent No.: US 9,917,598 B1
(45) Date of Patent: Mar. 13, 2018

(54) IMPLEMENTING PREEMPTIVE CUSTOMIZED CODESET CONVERTER SELECTION ON SAAS

(71) Applicant: International Business Machines Corporation, Armonk, NY (US)

(72) Inventors: Yu Gu, Cedar Park, TX (US); Peng Hui Jiang, Beijing (CN); Su Liu, Austin, TX (US); Johnny M. Shieh, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/359,193

(22) Filed: Nov. 22, 2016

(51) Int. Cl.
*H03M 7/30* (2006.01)
*G06F 9/54* (2006.01)

(52) U.S. Cl.
CPC ............ *H03M 7/702* (2013.01); *G06F 9/541* (2013.01)

(58) Field of Classification Search
CPC .............................. H03M 7/702; G06F 9/541
USPC ..................................................... 341/51, 52
See application file for complete search history.

(56) References Cited

U.S. PATENT DOCUMENTS

| | | | | |
|---|---|---|---|---|
| 5,062,108 A | * | 10/1991 | Bales | H04Q 11/0457 370/467 |
| 6,708,310 B1 | * | 3/2004 | Sung | G06F 17/2217 715/209 |
| 7,199,729 B2 | | 4/2007 | Chen et al. | |
| 7,278,100 B1 | | 10/2007 | Ehrman | |
| 7,703,004 B2 | | 4/2010 | Bier | |
| 7,936,287 B1 | * | 5/2011 | Lee | H04L 29/0809 341/176 |
| 8,296,747 B2 | | 10/2012 | Ishizaki et al. | |
| 8,704,687 B2 | | 4/2014 | Clissold et al. | |
| 9,438,269 B1 | * | 9/2016 | Li | H03M 7/02 |
| 2013/0091155 A1 | | 4/2013 | Mineo et al. | |
| 2013/0332899 A1 | | 12/2013 | Stewart et al. | |
| 2014/0035764 A1 | | 2/2014 | Issold et al. | |
| 2015/0138003 A1 | | 5/2015 | Liu et al. | |
| 2016/0057239 A1 | | 2/2016 | Clissold et al. | |

OTHER PUBLICATIONS

"CharacterSetDetection", ICU User guide, 2000-2009 http://userguide.icu-project.org/conversation/detection.

* cited by examiner

*Primary Examiner* — Brian Young
(74) *Attorney, Agent, or Firm* — Joan Pennington

(57) ABSTRACT

A method and apparatus are provided for implementing preemptive customized Codeset Converter Selection (CCS) on Software as a Service (SaaS) in a computer system. A codeset converter is automatically selected for operational modes, customer requests and service tasks which prompt the launching of the SaaS application. The CC selection is based upon history logs, content, and learned behavior performed as the application is launched and referenced without the user having to restart the session. Launching a new session is not needed for the enablement of the CC function.

18 Claims, 9 Drawing Sheets

200

SYSTEM MEMORY 106

(PREEMPTIVE CODESET CONVERTER SELECTION METHOD)

CC PREFERENCE MANAGER
250

CC SELECTIVE STRATEGIES
252

CC SELECTION PROFILES FOR USERS, APPLICATIONS, AND TASKS
254

SaaS SERVICE INTERFACE
256

CC CUSTOMIZING WIZARD
258

CC APPLICATION POOL
260

CC SELECTION DAEMON
262

SYSTEM DEFINED CODESET CONVERTERS
264

CUSTOMIZED CODESET CONVERTERS
266

FIG. 2

IMPLEMENTING PREEMPTIVE CUSTOMIZED CODESET CONVERTER SELECTION ON SAAS

FIELD OF THE INVENTION

The present invention relates generally to the data processing field, and more particularly, relates to method and apparatus for implementing preemptive customized Codeset Converter Selection (CCS) on Software as a Service (SaaS) in a computer system.

DESCRIPTION OF THE RELATED ART

For many years, operating systems (OS) have had to account for codesets. In computing, codesets are distinct languages, figuratively as a spoken and written language, as well as special symbols associated with scientific or a specific language or a specific region. For instance, the symbol for the Euro € or the umlaut Ë are simple examples of cultural or language specific symbols that need to be accounted for when the text from software is displayed by the operating system. Most software packages reference a required locale and codesets that must be installed on the OS when the application itself is being installed on the OS. And, the language settings of the user are then either automatically adjusted by installation or the user must edit their user preferences to include multiple codesets so that the OS can correctly display the symbols if they are to be displayed by the running application.

In an enterprise computing service, such as Software as a Service (SaaS) or cluster, a growing problem has arisen as the traditional install-applications-on-your-OS model is shifting to offerings provided to users on the cloud. These software offerings no longer reside on each user's personal workstation, but now reside as a cloud application. This is more commonly referred to by the acronym (SaaS) Software as a Service. One example of this is a move of Microsoft Office product from installation images on each user's system to a cloud-based SaaS model with monthly/yearly fees for accessing the application via the internet.

To deal the mixed use of multiple codesets on multicultural operating systems and applications, tools were created called codeset converters (CC). In case of input and output in different codesets, these are the translation tools of the OS that take the codeset input from the application, translate it to the correlated index of displayed glyph/font in output buffer, and then display the output onto the screen for the user to see. Of course, the CC works in reverse to ensure that the user can input required symbols correctly (such as the Euro monetary value) back to the program, rather than a garbage character, "?" question mark (subchar), or US dollar ($) symbol.

Currently for a user one of the problems is that with the decrease in the localized installation of the application, the interlock between the application and the codeset converter has decreased. Previous localized installation not only provided the codesets, the variant CCs needed to translate between differences in the default application and the OS are also provided. With SaaS, such helpful step is now skipped and often users may not realize that their default codeset and CC is incompatible with the SaaS offering until they encounter what looks like corrupted fonts or gibberish on the screen.

A need exists for an efficient and effective method and apparatus for implementing application, user, and task based codeset converter (CC) selection methods.

SUMMARY OF THE INVENTION

Principal aspects of the present invention are to provide a method and apparatus for implementing preemptive customized Codeset Converter Selection (CCS) on Software as a Service (SaaS) in a computer system. Other important aspects of the present invention are to provide such method and apparatus substantially without negative effects and that overcome many of the disadvantages of prior art arrangements.

In brief, a method and apparatus are provided for implementing preemptive customized Codeset Converter Selection (CCS) on Software as a Service (SaaS) in a computer system. A codeset converter is automatically selected for operational modes, customer requests and service tasks which prompt the launching of the SaaS application. The CC selection is based upon history logs, content, and learned behavior performed as the application is launched and referenced without the user having to restart the session. Launching a new session is not needed for the enablement of the CC function.

In accordance with features of the invention, a real-time codeset converter and loading mechanism is defined based on history logs and categorized user profiles, both in locale and remote.

In accordance with features of the invention, a real-time codeset converter and loading mechanism is defined based on content, for example, when the user opens a document, a quick scan of the document is done and specific symbols are located. Then, installed codeset directories are scanned to find various potential types of codesets that match.

In accordance with features of the invention, a real-time codeset converter and loading mechanism is defined based on learned behavior that the OS observes, for example, the OS may observe that the user is corresponding with people in a different country via chat or email. Then the codeset dynamically switches to localized codesets as needed.

In accordance with features of the invention, the CC selection method enables features, Application Programming Interfaces (APIs), and Graphical User Interface (GUI) which help SaaS users to dynamically select a preferred CC for a task, and application in real time.

In accordance with features of the invention, a method includes a Codeset Converter (CC) preference manager, CC selective strategies, CC selection profiles for users, applications, and tasks, a SaaS service interface, a CC customizing wizard, a CC application pool, a CC selection daemon, system defined Codeset Converters, and customized Codeset Converters.

BRIEF DESCRIPTION OF THE DRAWINGS

The present invention together with the above and other objects and advantages may best be understood from the following detailed description of the preferred embodiments of the invention illustrated in the drawings, wherein:

FIG. 2 is a block diagram of the memory system of the data processing computer system FIG. 1 in accordance with a preferred embodiment;

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and computer system are provided for implementing preemptive customized Codeset Converter Selection (CCS) on Software as a Service (SaaS) in a computer system. A codeset converter is automatically selected as the application is launched and referenced without the user having to restart the session. Launching a new session is not needed for the enablement of the CC function.

Figure 1:
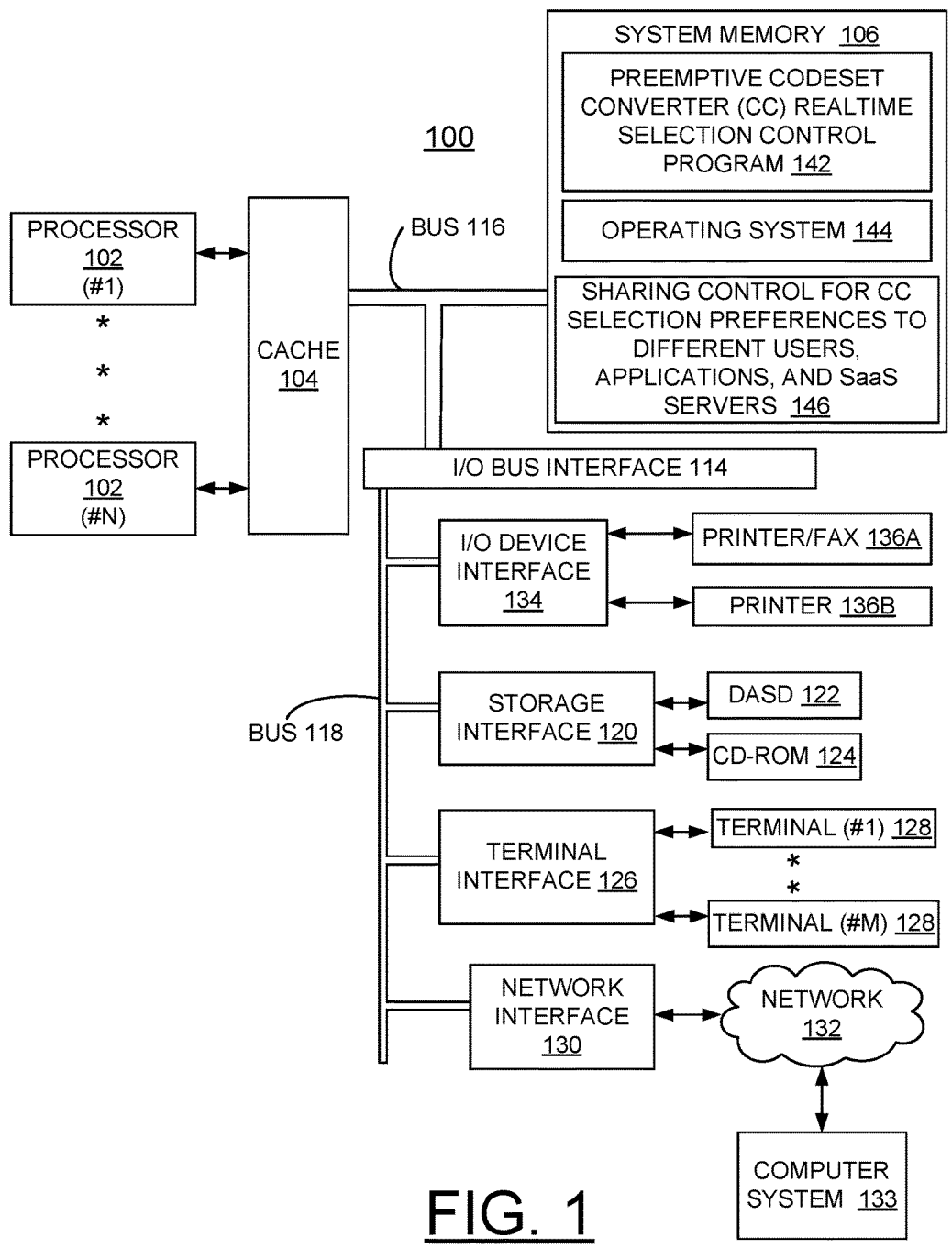
FIG. 1 is a block diagram of an example data processing computer system for implementing preemptive customized Codeset Converter Selection (CCS) on Software as a Service (SaaS) in accordance with a preferred embodiment.

Having reference now to the drawings, in FIG. 1, there is shown a data processing computer system embodying the present invention generally designated by the reference character 100 for implementing preemptive customized Codeset Converter Selection (CCS) on Software as a Service (SaaS) in accordance with the preferred embodiment. Data processing computer system 100 includes one or more processors 102 or general-purpose programmable central processing units (CPUs) 102, #1-N. As shown, data processing computer system 100 includes multiple processors 102 typical of a relatively large system; however, system 100 can include a single CPU 102. Computer system 100 includes a cache memory 104 connected to each processor 102.

Data processing computer system 100 includes a system memory 106. System memory 106 is a random-access semiconductor memory for storing data, including programs. System memory 106 is comprised of, for example, a dynamic random access memory (DRAM), a synchronous direct random access memory (SDRAM), a current double data rate (DDRx) SDRAM, non-volatile memory, optical storage, and other storage devices.

I/O bus interface 114, and buses 116, 118 provide communication paths among the various system components. Bus 116 is a processor/memory bus, often referred to as front-side bus, providing a data communication path for transferring data among CPUs 102 and caches 104, system memory 106 and I/O bus interface unit 114. I/O bus interface 114 is further coupled to system I/O bus 118 for transferring data to and from various I/O units.

As shown, data processing computer system 100 includes a storage interface 120 coupled to storage devices, such as, a direct access storage device (DASD) 122, and a CD-ROM 124. Data processing computer system 100 includes a terminal interface 126 coupled to a plurality of terminals 128, #1-M, a network interface 130 coupled to a network 132, such as the Internet, local area or other networks, shown connected to another separate computer system 133, and a I/O device interface 134 coupled to I/O devices, such as a first printer/fax 136A, and a second printer 136B.

I/O bus interface 114 communicates with multiple I/O interface units 120, 126, 130, 134, which are also known as I/O processors (IOPs) or I/O adapters (IOAs), through system I/O bus 116. System I/O bus 116 is, for example, an industry standard PCI bus, or other appropriate bus technology.

System memory 106 stores a preemptive codeset converter (CC) real time selection control program 142 for implementing preemptive codeset converter selection in accordance with the preferred embodiments, an operating system 144 and a control for sharing CC selection preferences to different users, applications and SaaS servers 146 in accordance with the preferred embodiments.

Data processing computer system 100 may be, for example, an IBM® eServer™ System p® computer system, running the Advanced Interactive Executive (AIX®) operating system or the LINUX® operating system. Data processing system 100 may be a symmetric multiprocessor (SMP) system including the plurality of processors 102.

In accordance with features of the invention, a preemptive codeset converter selection method is provided for implementing CC selection to adapt to application based on history, content, and learned behavior.

Referring to FIG. 2, there is shown an example preemptive codeset converter selection method generally designated by the reference character 200 stored in memory system 106 of the data processing computer system 100 in accordance with a preferred embodiment. The method comprises (method includes a Codeset Converter (CC) preference manager 250, CC selective strategies 252, CC selection profiles for users, applications, and tasks 254, a SaaS service interface 256, a CC customizing wizard 258, a CC application pool 260, a CC selection daemon 262, system defined Codeset Converters 264, and customized Codeset Converters 266. The example preemptive codeset converter selection method 200 is further illustrated and described with respect to FIGS. 4A, 4B, and 4C.

Figure 3A:
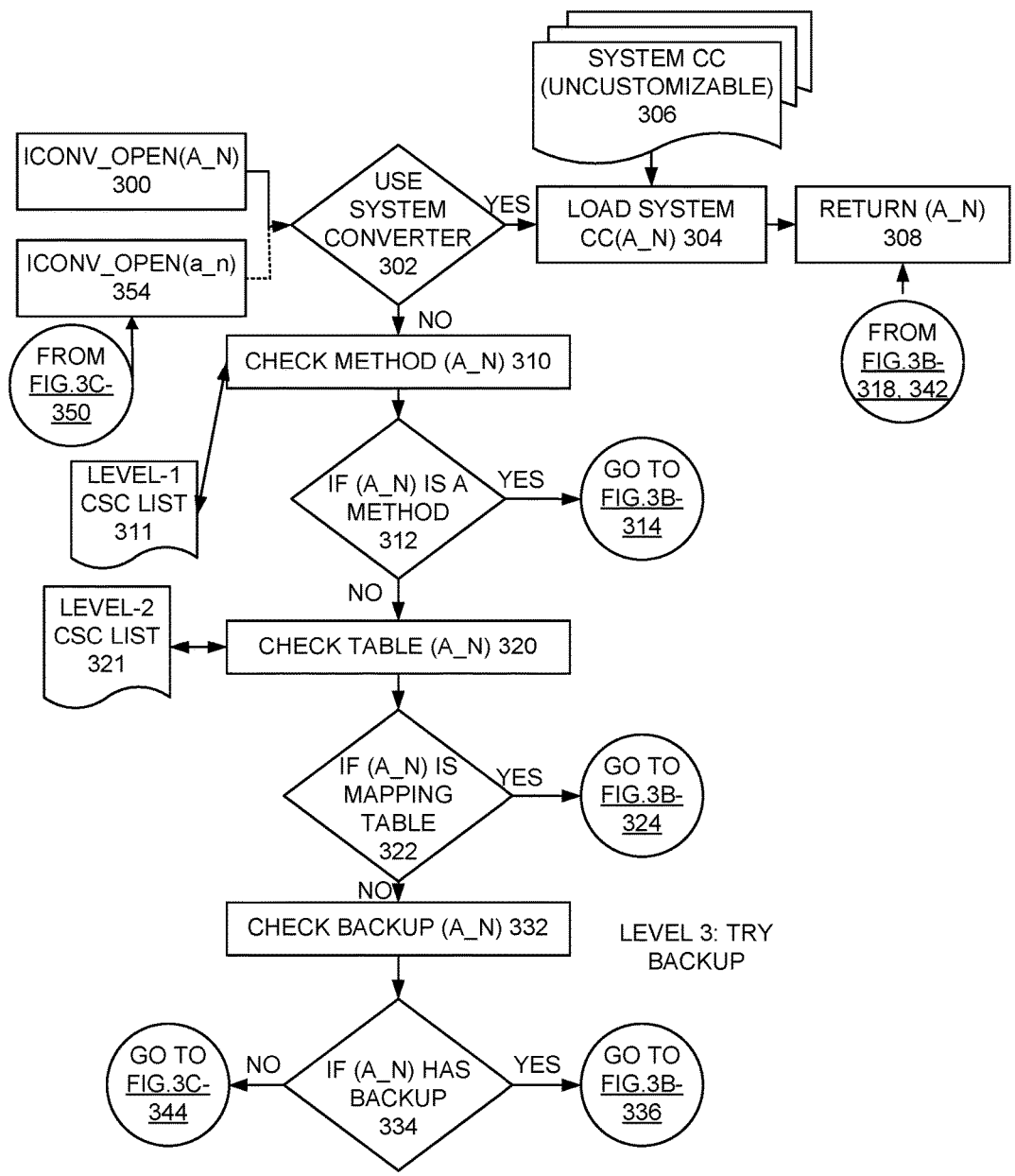
FIGS. 3A, 3B and 3C is a functional block and flow diagram illustrating a high level system design framework and operations in accordance with a preferred embodiment.
Figure 3B:
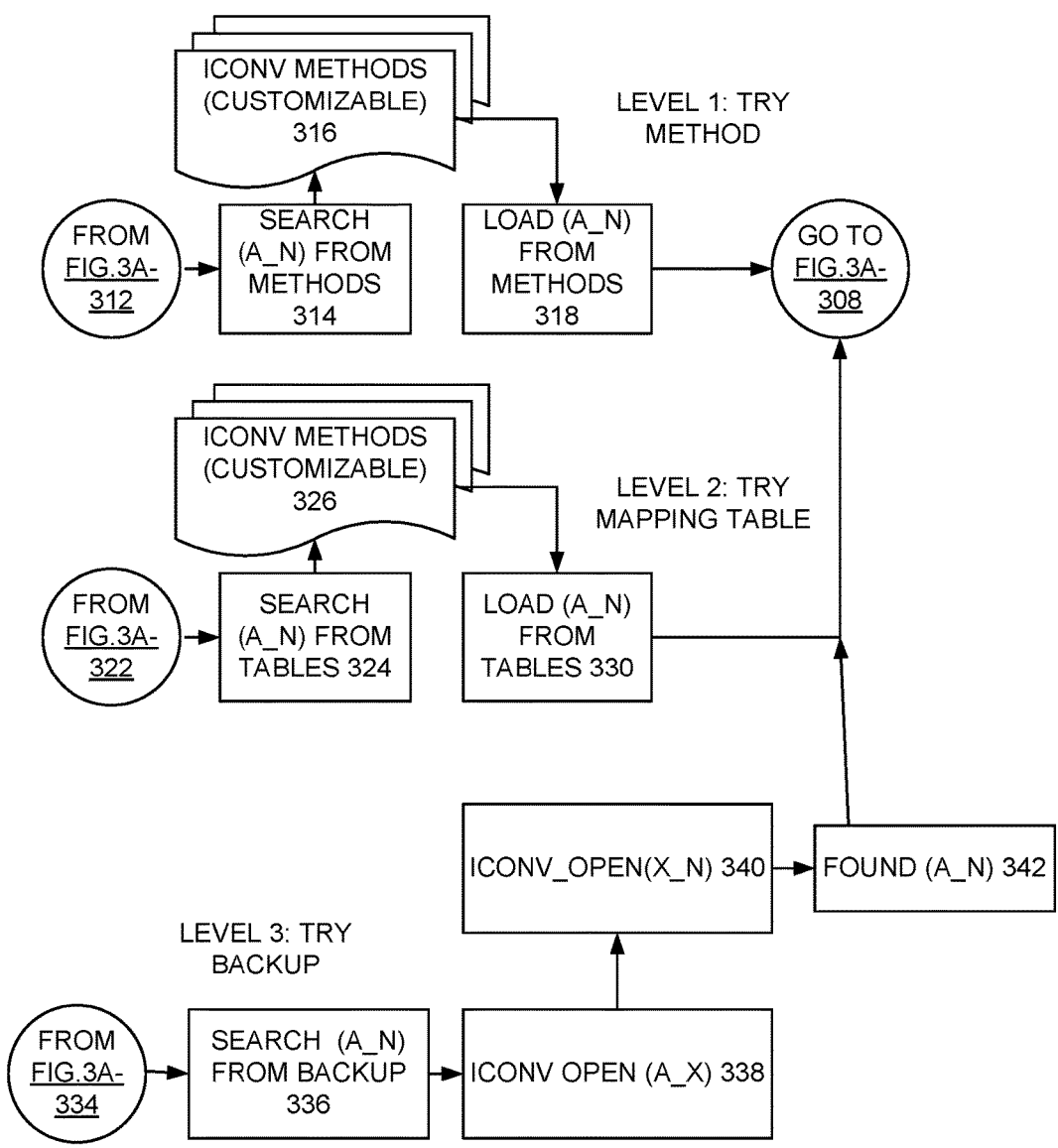
Figure 3C:
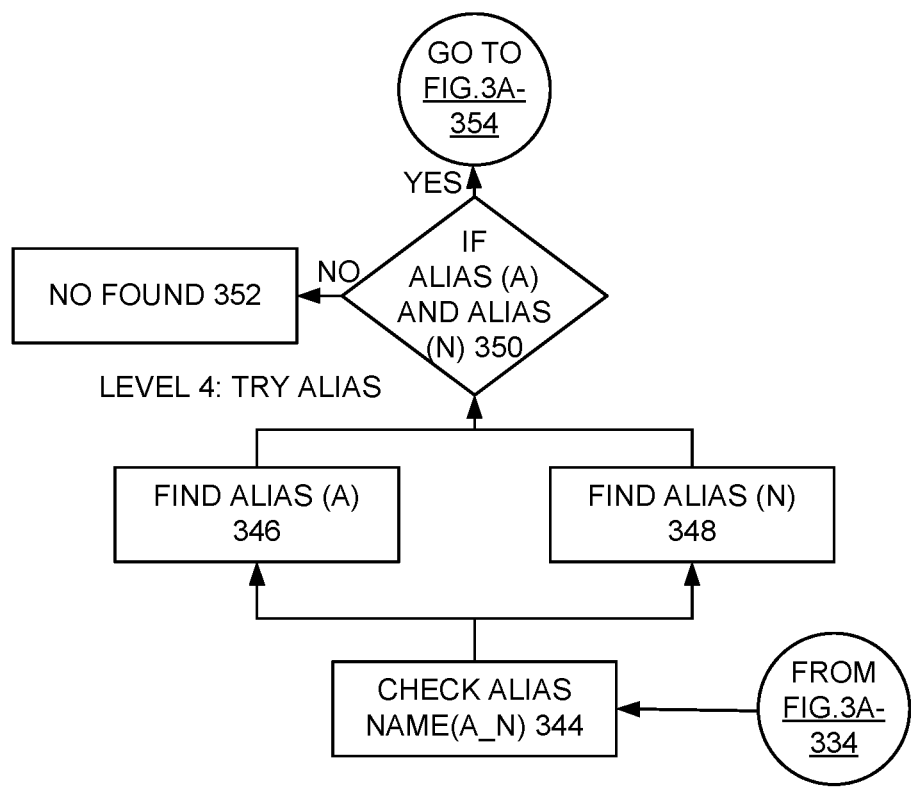

Referring now to FIGS. 3A, 3B, and 3C, there is shown a functional block and flow diagram illustrating a high level system design framework and operations of a hybrid open architecture for codeset convertors in accordance with a preferred embodiment. At a block 301, a codeset converter application (A_N) is opened. At a decision block 302, checking for use of system codeset converter is performed. If yes, a system codeset converter (A_N) is loaded at a block 304. A system CC uncustomizable at a block 306 applied to block 304 and application (A_N) is returned at a block 308. Checking for method (A_N) is performed at a block 310 that is coupled to a Level-1 CSC List at a block 311. Checking if method (A_N) is A method is performed at a decision block 312. If A method, operations continue at a block 314 in FIG. 3B.

In FIG. 3B, at block 314 searching (A_N) from methods is performed coupled to iconv methods (customizable) at a block 316. At a block 318, load (A_N) from methods is performed. Then operations return to block 308 in FIG. 3A.

In FIG. 3A, when the method is not A method, then checking table (A_N) is performed at a block 320 is performed. A level 2 CSC list at a block 311 is coupled to block 320. Checking whether (A_N) is a mapping table is performed as indicated at a decision block 322. If yes, operations continue at a block 324 in FIG. 3B.

In FIG. 3B, at a block 324 searching (A_N) is performed. Block 324 is coupled to iconv tables (customizable) at a block 326. At a block 330, load (A_N) from tables is performed. Then operations return to block 308 in FIG. 3A.

In FIG. 3A, if (A_N) is not a mapping table, checking backup is performed at a block 332. When backup is identified at decision block 332, operations go to a block 336 in FIG. 3B. When backup is not identified at decision block 332, operations go to a block 344 in FIG. 3C.

In FIG. 3B, at a block 336 searching (A_N) from backup is performed. At a block 338, iconv_open (A_X) is performed. At a block 340, iconv_open (X_N) is performed. Then operations return to block 308 in FIG. 3A.

In FIG. 3C, at a block 344 checking alias name (A_N) is performed. At a block 346, alias (A) is found. At a block 348, alias (N) is found. At a decision block 350, checking if alias (A) and alias (N) is performed. If not, not found is returned at a block 352. Then if alias (A) and alias (N) are found, operations go to block 354 in FIG. 3A, where a next codeset converter application (a_n) is opened.

Figure 4A:
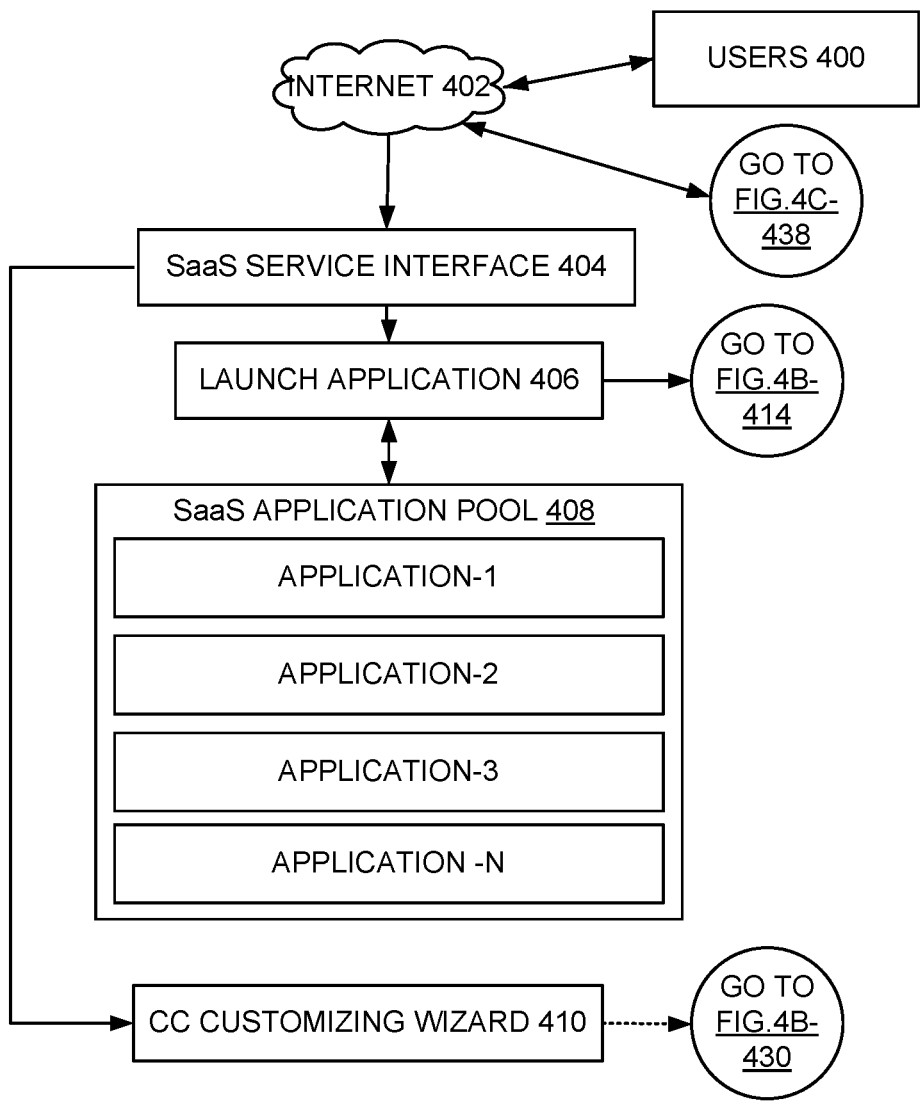
FIGS. 4A, 4B and 4C is a functional block and flow diagram illustrating preemptive customized Codeset Converter Selection (CCS) on Software as a Service (SaaS) in accordance with a preferred embodiment.
Figure 4B:
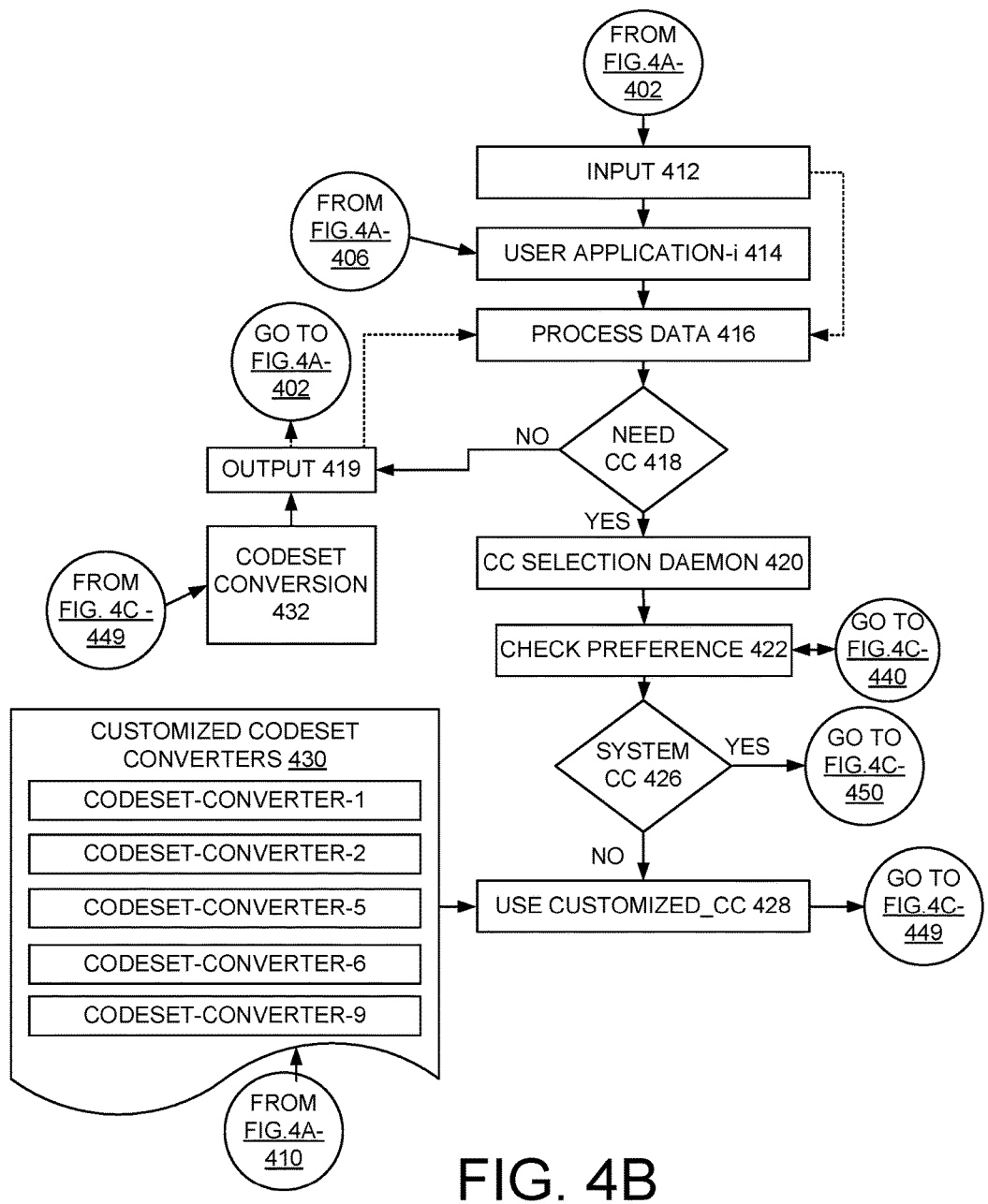
Figure 4C:
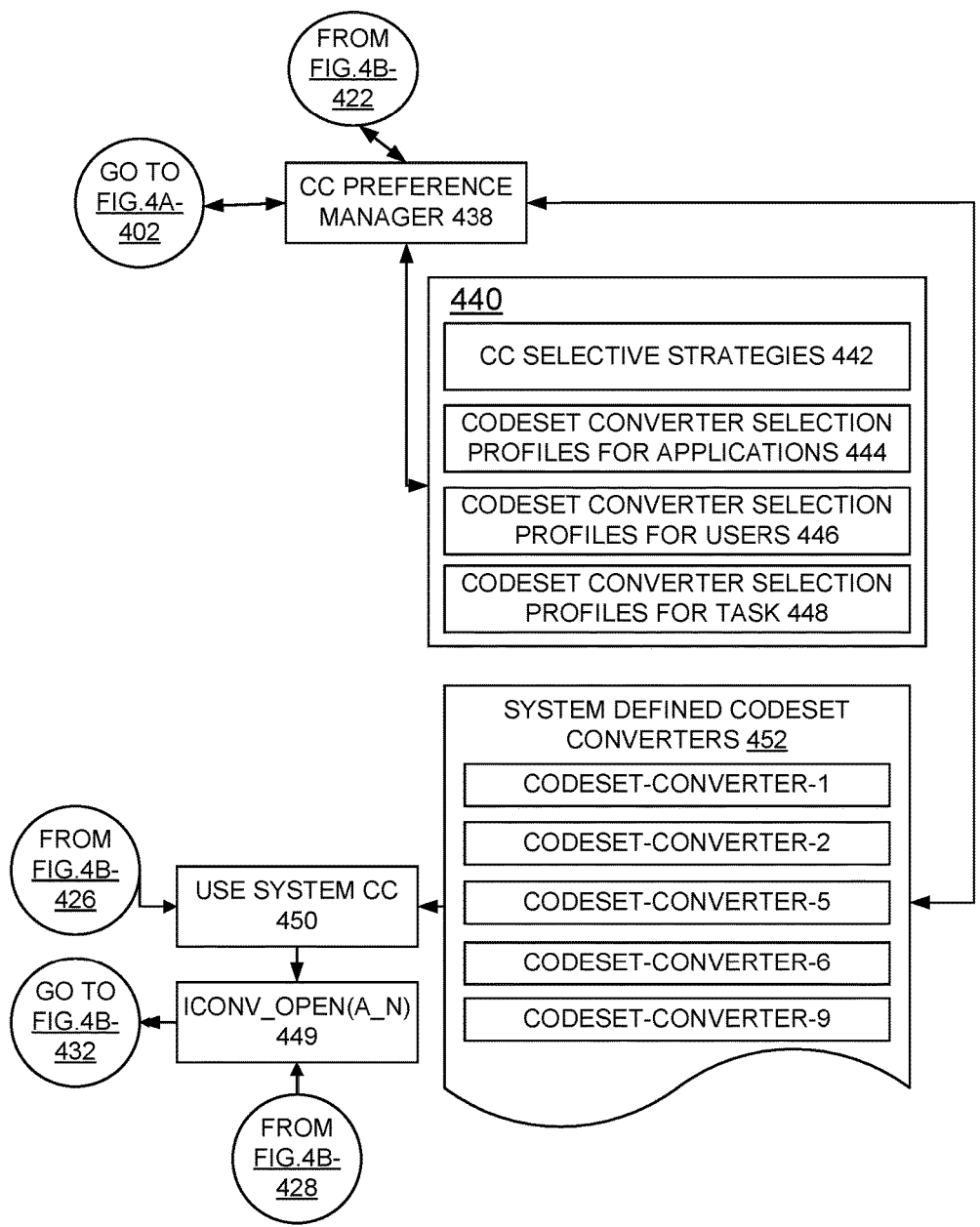

Referring now to FIGS. 4A, 4B, and 4C, there is shown a functional block and flow diagram illustrating preemptive customized Codeset Converter Selection (CCS) on Software as a Service (SaaS) of the preferred embodiment in the system 100 of FIG. 1 starting with users indicated at a block 400 coupled the internet at a block 402.

In FIG. 4A, the internet 402 is coupled to a block 438 in FIG. 4C and a SaaS service interface at a block 404, as shown at block 256 of the preemptive codeset converter selection method 200 in FIG. 2. The internet 402 is coupled to a block 412 in FIG. 4B, which receives an input. A launch application at a block 406 is coupled to a block 414 in FIG. 4B, and to a SaaS application pool, as shown at block 260 of the preemptive codeset converter selection method 200 in FIG. 2. The SaaS service interface 400 is coupled to a codeset converter customizing wizard at a block 410, as shown at block 258 of the preemptive codeset converter selection method 200 in FIG. 2. The codeset converter customizing wizard is coupled to stored customized codeset converters at a block 430 in FIG. 4B, as shown at block 266 of the preemptive codeset converter selection method 200 in FIG. 2.

In FIG. 4B after the application is launched at block 406 in FIG. 4A, at a block 414, an application i is used, and data is processed at a block 416. Checking if a codeset converter is needed is performed at a decision block 418. When a codeset converter is needed, a CC selection daemon is run at a block 420, as shown at block 262 of the preemptive codeset converter selection method 200 in FIG. 2. Checking for preferences is performed at a block 422, coupled to a block 440 in FIG. 4C. Checking if a system codeset converter is used is performed at a decision block 426. If yes, go to a block 450 in FIG. 4C. If no, a use customized codeset converter at a block 428 is performed. The customized codeset converters at block 430 is coupled to the use customized codeset converter block 428. The use customized codeset converter block 428 is coupled to an iconv_open (A, N) at a block 449 in FIG. 4C.

In FIG. 4C a use system codeset converter at a block 450, is coupled to system defined codeset converters 452, including codeset-converters 1-9 as shown. System defined codeset converters 452 is shown at block 264 of the preemptive codeset converter selection method 200 in FIG. 2. The CC preference manager 438 is coupled to the system defined codeset converters 452. The use system codeset converter 450 is coupled to an iconv_open (A, N) at a block 449, and operations go to codeset conversion at a block 432 in FIG. 4B.

In FIG. 4C, as shown stored at block 440 are CC selective strategies 442, as shown at block 252 of the preemptive codeset converter selection method 200 in FIG. 2. Also stored at block 440 are codeset converter selection profiles for applications 444, codeset converter selection profiles for users 446, and codeset converter selection profiles for tasks 448, as shown at block 254 of the preemptive codeset converter selection .method 200 in FIG. 2. A codeset converter preference manager at a block 438, as shown at block 250 of the preemptive codeset converter selection method 200 in FIG. 2, is coupled to block 440 and the CC selective strategies 442, codeset converter selection profiles for applications 444, codeset converter selection profiles for users 446, and codeset converter selection profiles for tasks 448 are used to select a codeset converter.

In FIG. 4B, the codeset conversion block 432 referenced by iconv_open (A, N) at block 449 in FIG. 4C, is coupled to output 419, which is coupled to the internet 402.

Figure 5:
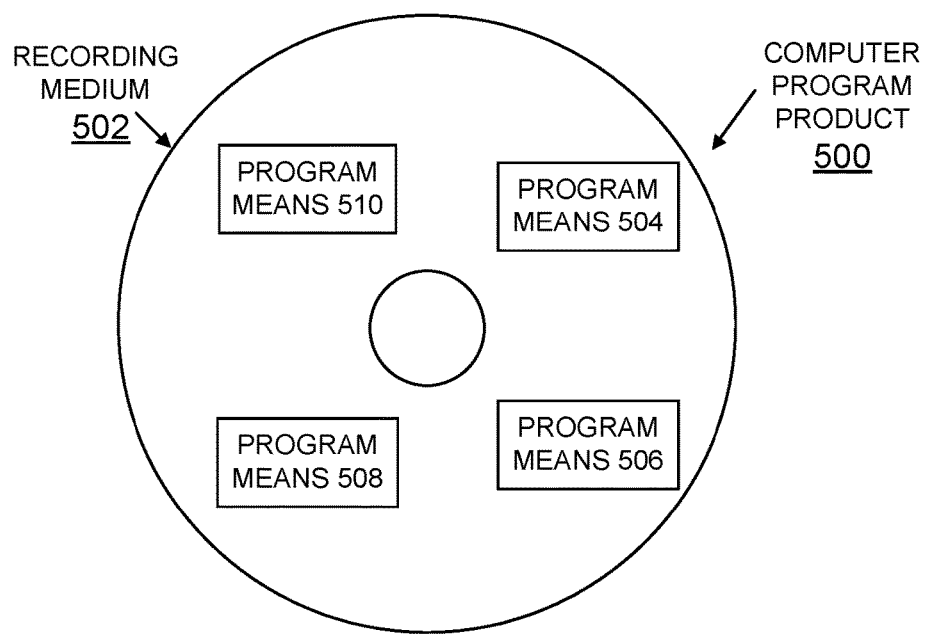
FIG. 5 is a block diagram illustrating a computer program product in accordance with the preferred embodiment.

Referring now to FIG. 5, an article of manufacture or a computer program product 500 of the invention is illustrated. The computer program product 500 is tangibly embodied on a non-transitory computer readable storage medium that includes a recording medium 502, such as, a floppy disk, a high capacity read only memory in the form of an optically read compact disk or CD-ROM, a tape, or another similar computer program product. Recording medium 502 stores program means 504, 506, 508, and 510 on the medium 502 for carrying out the methods for implementing preemptive customized Codeset Converter Selection (CCS) on Software as a Service (SaaS) of the preferred embodiment in the system 100 of FIG. 1.

A sequence of program instructions or a logical assembly of one or more interrelated modules defined by the recorded program means 504, 506, 508, and 510, direct the system 100 for implementing preemptive customized Codeset Converter Selection (CCS) on Software as a Service (SaaS) of the preferred embodiment.

While the present invention has been described with reference to the details of the embodiments of the invention shown in the drawing, these details are not intended to limit the scope of the invention as claimed in the appended claims.

What is claimed is:

1. An apparatus for implementing preemptive customized Codeset Converter Selection (CCS) on Software as a Service (SaaS) in a computer system comprising:
   a processor,
   a Codeset Converter preference manager tangibly embodied in a non-transitory machine readable medium used to implement preemptive customized Codeset Converter Selection,
   said processor using said Codeset Converter preference manager, automatically selecting a codeset converter (CC) for operational modes, customer requests and service tasks which prompt the launching of a SaaS application, performing CC selection based upon history logs, content, and learned behavior as the SaaS application is launched and referenced without the user having to restart the session, and wherein launching a new session is not needed for the enablement of the CC function; and said processor using said Codeset Converter preference manager and a CC selection daemon used for checking preferences and selective strategies.

2. The apparatus as recited in claim 1 includes said processor using said Codeset Converter preference manager and CC selective strategies for automatically selecting a codeset converter (CC).

3. The apparatus as recited in claim 1 includes said processor using said Codeset Converter preference manager and CC selection profiles for users, applications, and tasks used for performing CC selection.

4. The apparatus as recited in claim 1 includes said processor using said Codeset Converter preference manager and a SaaS service interface used for launching an application.

5. The apparatus as recited in claim 1 includes said processor using said Codeset Converter preference manager and a CC customizing wizard used for maintaining customized codeset converters.

6. The apparatus as recited in claim 1 includes said processor using said Codeset Converter preference manager and a CC application pool used for launching an application.

7. The apparatus as recited in claim 1 includes said processor using said Codeset Converter preference manager and system defined Codeset Converters used for automatically selecting a codeset converter (CC).

8. The apparatus as recited in claim 7 includes said processor using said Codeset Converter preference manager and customized Codeset Converters used for automatically selecting a codeset converter (CC).

9. A computer-implemented method for implementing preemptive customized Codeset Converter Selection (CCS) on Software as a Service (SaaS) in a computer system said computer-implemented method comprising:

automatically selecting a codeset converter (CC) for operational modes, customer requests and service tasks which prompt the launching of the SaaS application;

performing CC selection based upon history logs, content, and learned behavior as the SaaS application is launched and referenced without the user having to restart the session, and wherein launching a new session is not needed for the enablement of the CC function; and using CC selection profiles for users, applications, and tasks for performing CC selection.

10. The method as recited in claim 9 includes using CC selective strategies for automatically selecting a codeset converter (CC).

11. A computer-implemented method for implementing preemptive customized Codeset Converter Selection (CCS) on Software as a Service (SaaS) in a computer system said computer-implemented method comprising:

automatically selecting a codeset converter (CC) for operational modes, customer requests and service tasks which prompt the launching of the SaaS application;

performing CC selection based upon history logs, content, and learned behavior as the SaaS application is launched and referenced without the user having to restart the session, and wherein launching a new session is not needed for the enablement of the CC function; and using a SaaS service interface for launching an application.

12. The method as recited in claim 9 includes using a CC customizing wizard for maintaining customized codeset converters.

13. The method as recited in claim 9 includes using a CC application pool for launching an application.

14. The method as recited in claim 9 includes using a CC selection daemon for checking preferences and selective strategies.

15. The method as recited in claim 9 includes using a CC selection daemon for automatically selecting a system defined codeset converter and a customized codeset converter.

16. The method as recited in claim 9 includes using system defined codeset converters for automatically selecting a codeset converter (CC).

17. The method as recited in claim 9 includes using customized codeset converters for automatically selecting a codeset converter (CC).

18. The method as recited in claim 9 includes sharing codeset converter preferences to different users, applications, and SaaS servers.

* * * * *